United States Patent
Lee et al.

(10) Patent No.: US 9,461,256 B2
(45) Date of Patent: Oct. 4, 2016

(54) FLEXIBLE DISPLAY DEVICE

(71) Applicant: SAMSUNG DISPLAY CO., LTD., Yongin-si, Gyeonggi-Do (KR)

(72) Inventors: Jong-Nan Lee, Hwaseong-si (KR); Kyu Seok Kim, Yongin-si (KR); Jae-Ho Jung, Cheonan-si (KR); Byung-Woong Han, Incheon (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/843,077

(22) Filed: Sep. 2, 2015

(65) Prior Publication Data

US 2016/0190489 A1    Jun. 30, 2016

(30) Foreign Application Priority Data

Dec. 29, 2014   (KR) .................. 10-2014-0192663

(51) Int. Cl.
*H01L 29/18* (2006.01)
*H01L 51/00* (2006.01)
*H01L 51/52* (2006.01)

(52) U.S. Cl.
CPC ....... *H01L 51/0097* (2013.01); *H01L 51/5237* (2013.01)

(58) Field of Classification Search
CPC .................................................. H01L 51/0097
USPC ........................................................... 257/88
See application file for complete search history.

(56) References Cited

U.S. PATENT DOCUMENTS

| | | | |
|---|---|---|---|
| 2009/0026934 A1* | 1/2009 | Fujita | C09J 7/021 313/504 |
| 2011/0103021 A1 | 5/2011 | Janssen et al. | |
| 2011/0261032 A1* | 10/2011 | Terashima | G02F 1/167 345/204 |
| 2012/0222805 A1* | 9/2012 | Shintani | C09J 7/0289 156/240 |
| 2012/0275013 A1* | 11/2012 | Hayashi | G02F 1/167 359/296 |
| 2013/0033488 A1* | 2/2013 | Takahashi | H04N 13/0418 345/419 |

FOREIGN PATENT DOCUMENTS

| | | |
|---|---|---|
| JP | 3565929 B2 | 6/2004 |
| JP | 2011-516633 A | 5/2011 |
| KR | 10-1003840 B1 | 12/2010 |
| WO | WO 2009/115512 A1 | 9/2009 |

* cited by examiner

*Primary Examiner* — Anthony Ho
(74) *Attorney, Agent, or Firm* — Lee & Morse, P.C.

(57) ABSTRACT

A flexible display device, including a display panel for displaying an image; and a flexible substrate having a side on which the display panel is supported, the flexible substrate including a plastic film having at least one of a carbon material and a graphite material.

9 Claims, 4 Drawing Sheets

FLEXIBLE DISPLAY DEVICE

CROSS-REFERENCE TO RELATED APPLICATION

Korean Patent Application No. 10-2014-0192663, filed on Dec. 29, 2014, in the Korean Intellectual Property Office, and entitled: "Flexible Display Device," is incorporated by reference herein in its entirety.

BACKGROUND

1. Field

Embodiments relate to a flexible display device.

2. Description of the Related Art

A display device, such as, e.g., an organic light emitting device or a liquid crystal display, may include a substrate on which elements are formed. A glass substrate or a polymer substrate may be used as the substrate of an organic light emitting device or a liquid crystal display.

SUMMARY

Embodiments may be realized by providing a flexible display device, including a display panel for displaying an image; and a flexible substrate having a side on which the display panel is supported, the flexible substrate including a plastic film having at least one of a carbon material and a graphite material.

The flexible substrate may further include a polyethylene terephthalate (PET) coating layer on respective sides of the plastic film.

Each PET coating layer may have a thickness equal to 5 to 10% of a total thickness of the flexible substrate.

The plastic film may include carbon particles mixed in a polymer resin.

The plastic film may include a graphite sheet stacked on a polymer resin.

The plastic film may further include an electrification inhibitor.

The electrification inhibitor may include one or more of conductive polymers, carbon black, metal powder, metal salt, or a combination thereof.

The plastic film may include a polymer resin.

The flexible display device may further include an inorganic fiber material mixed in the polymer resin.

The flexible display may further include a polyethylene terephthalate (PET) coating layer on the side on which the display panel is supported.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
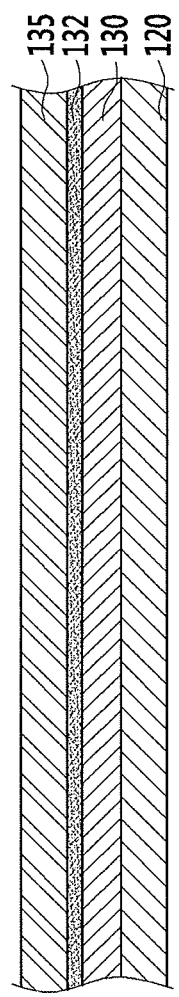
FIG. 1 illustrates a cross-sectional view of a display panel and a substrate of a flexible display device according to a first exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The drawings and description are to be regarded as illustrative in nature and not restrictive. Like reference numerals designate like elements throughout the specification. The size and thickness of each configuration shown in the drawings are arbitrarily shown for understanding and ease of description, but embodiments are not limited thereto.

When it is said that any part, such as a layer, film, region, or plate, is positioned on another part, it means the part is directly on the other part or above the other part with at least one intermediate part. When it is described that an element is "coupled" to another element, the element may be "directly coupled" to the other element or "electrically coupled" to the other element through a third element.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

FIG. 1 illustrates a cross-sectional view of a display panel and a substrate of a flexible display device according to a first exemplary embodiment.

The flexible substrate 120 of the flexible display device according to the present exemplary embodiment may be configured by mixing a carbon material and a plastic film, which may be a base film, and may be formed by forming a display panel 130 on the flexible substrate 120.

The display panel 130 may include a plurality of pixels arranged in a matrix form and may display an image. The display panel 130 may be formed on the flexible substrate 120 and may have a flexible characteristic, and may be configured with a curved, bendable, or foldable panel.

An optical film 135 may be attachable to the display panel 130 by an adhesive layer 132. The optical film 135 may include a polarization film and a phase difference film. The polarization film may polarize incident light that is input to the display panel 130 and reflected light that is generated when the incident light is reflected from the display panel 130. The phase difference film may be disposed nearer the display panel 130 than the polarization film and may control phases of the incident light and the reflected light.

In an embodiment, the display panel 130 may be configured with an organic light emitting panel including an organic emission layer in the present exemplary embodiment.

Figure 2:
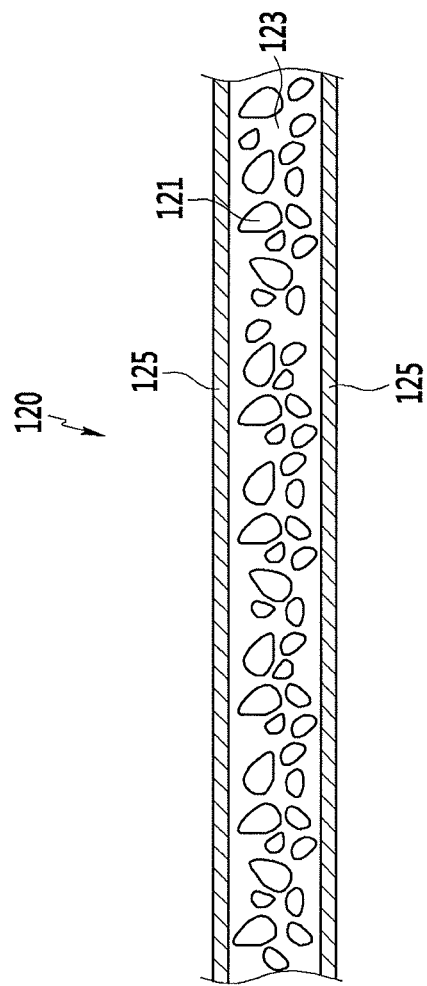
FIG. 2 illustrates a magnified drawing of a substrate of a flexible display device according to a first exemplary embodiment.

FIG. 2 illustrates a magnified drawing of the flexible substrate 120 of a flexible display device according to a first exemplary embodiment.

Referring to FIG. 2, the flexible substrate 120 may be manufactured to be a plastic film by mixing polymer resin 123 and carbon particles 121, and the carbon particles 121 may be uniformly or randomly dispersed and arranged on the polymer resin 123 along an entirety thereof. The carbon particles may have varying sizes or may have a uniform size, for example, thousands of angstroms. The polymer resin may be a supporting portion made of a polymer material, and may be made of a heat hardened resin, for example, a polyimide.

The flexible substrate 120 may include a polyethylene terephthalate (PET) coating layer 125 on respective sides of the plastic film. Each PET coating layer 125 may have a thickness equal to 5 to 10% of a total thickness of the flexible substrate 120, and may be transparent. The PET coating layer 125 may prevent the carbon particles 121 from smearing or from making dust.

An inorganic fiber material may be randomly or uniformly dispersed to, e.g., dispersed in, the polymer resin 123. Since the inorganic fiber material is randomly dispersed to, e.g., dispersed in, the polymer resin 123, deformation of the plastic film may be prevented and horizontal contraction that may occur because of heat may be prevented, and the plastic film may be prevented from being bent, e.g., by heat. The inorganic fiber material may not be visibly distinguishable from the polymer resin 123.

Inorganic fiber material may absorb a mechanical force applied from the outside or may transfer a mechanical force applied from the outside to another layer, and the inorganic fiber material may be prevented from being damaged by the force applied from the outside.

The inorganic fiber material may be included in an amount equal to about 20 to 40 wt % of the total content of a polymer resin, an inorganic fiber material, and an electrification inhibitor. When the inorganic fiber material is maintained within this range, the contraction caused by heat may be prevented, mechanical strength may be increased, and a flexible characteristic may be simultaneously maintained.

The plastic film may include an electrification inhibitor. The electrification inhibitor may be made of a conductive material, and, for example, may include conductive polymer, carbon black, metal powder, metal salt, or a combination thereof.

The electrification inhibitor may be particles, for example, in a form of powder, and may be uniformly distributed in the polymer resin.

The flexible substrate 120 made of polymer resin may be attached to the glass substrate, and may be detached from the glass substrate after a process is performed. Attaching or detaching may be performed, for example, using laser beams, and a static electricity fault may occur at the time of attaching or detaching.

The electrification inhibitor may prevent or reduce static electricity occurring during attaching to or detaching from the glass substrate, and may prevent or reduce the static electricity from flowing to an element of the display panel 130 on an upper part through the flexible substrate 120. Therefore, a static electricity fault may be prevented or reduced without the need of forming an electrification inhibiting layer on the flexible substrate 120. The electrification inhibitor may not be visibly distinguishable from the polymer resin 123.

The electrification inhibitor may be included in an amount equal to about 2 to 10 wt % of the total content of the polymer resin, the inorganic fiber material, and the electrification inhibitor.

When the inorganic fiber material is maintained within this range, sheet resistance of the flexible substrate 120 may be maintained to be substantially below $10^{11}\Omega$, and when the sheet resistance is maintained within this range, deformation of the element formed on the flexible substrate 120 by the static electricity may be prevented. For example, if sheet resistance is maintained to be about less than about $10^3$ to $10^{11}\Omega$, deformation of the element formed on the flexible substrate 120 by static electricity may be prevented.

Figure 3:
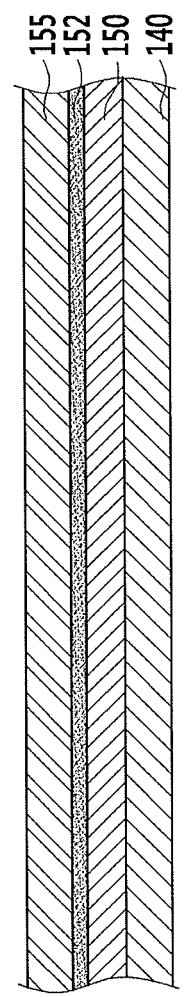
FIG. 3 illustrates a cross-sectional view of a display panel and a substrate of a flexible display device according to a second exemplary embodiment.
Figure 4:
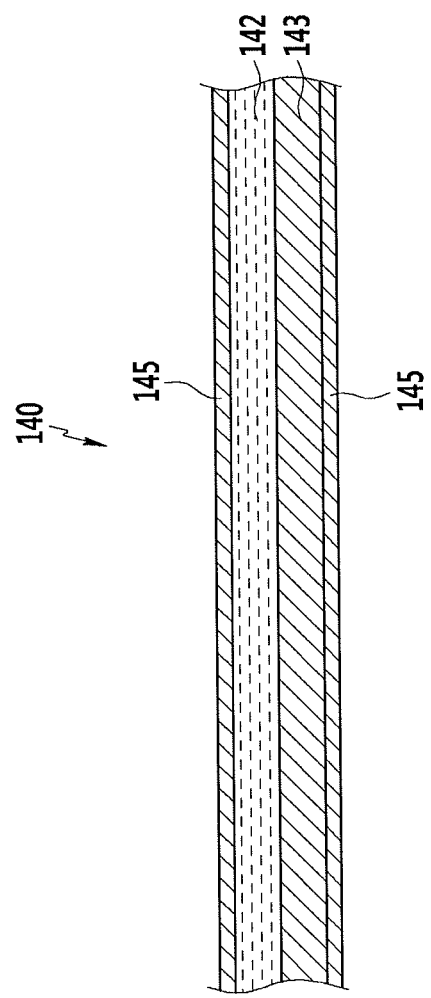
FIG. 4 illustrates a magnified cross-sectional view of a substrate of a flexible display device according to a second exemplary embodiment.

FIG. 3 illustrates a cross-sectional view of a display panel and a substrate of a flexible display device according to a second exemplary embodiment. FIG. 4 illustrates a magnified cross-sectional view of a substrate of a flexible display device according to a second exemplary embodiment.

Regarding the flexible substrate 140 of the display device according to the present exemplary embodiment, a graphite material may be stacked on the plastic film that may be the base film, and the display panel 150 may be formed on the flexible substrate 140.

In the present exemplary embodiment, the display panel 150 may be configured to display an image by providing a plurality of pixels that may be arranged in a matrix form. The display panel 150 may be formed on the flexible substrate 140 and may be flexible, and may be configured with a curved, bendable, or foldable panel.

An optical film 155 may be attached to the display panel 150 by an adhesive layer 152. The optical film 155 may include a polarization film and a phase difference film. The polarization film may polarize incident light that is input to the display panel 150 and reflected light that is generated when the incident light is reflected from the display panel 150. The phase difference film may be disposed nearer the display panel 150 than the polarization film and may control phases of the incident light and the reflected light.

In an embodiment, the display panel 150 may be configured with an organic light emitting panel including an organic emission layer in the present exemplary embodiment.

Referring to FIG. 4, the flexible substrate 140 according to the present exemplary embodiment may be manufactured to be a plastic film by stacking a graphite sheet 142 on a polymer resin 143. The polymer resin 143 may be a supporting portion made of a polymer material, and may be made of a heat hardened resin, for example, a polyimide. The polymer resin 143 may include the carbon material, the inorganic fiber material and/or the electrification inhibitor noted above.

The flexible substrate 140 may include a polyethylene terephthalate (PET) coating layer 145 on respective sides of the plastic film. Each PET coating layer 145 may have a thickness equal to 5 to 10% of a total thickness of the flexible substrate 140, and may be transparent. The PET coating layer 145 may prevent generation of foreign particles from the polymer resin 143 or the graphite sheet 142.

By way of summation and review, glass substrates may be heavy and fragile, which may impose limits to portability and displaying of, e.g., use in, wide screens. Glass substrates may be damaged by external impacts, and it may be difficult to apply glass substrates to flexible display devices.

Polymer substrates may be made of a flexible material, and may provide, for example, portability, safety, or light weight, especially compared to glass substrates. The elements, e.g., polymer substrates, may be manufactured by deposition or printing, and production costs of polymer substrates may be reduced. Display devices may be manufactured according to a roll-to-roll process differing from a comparative sheet-based process, and mass production may allow low-cost display devices to be manufactured.

Provided is a flexible display device that may improve an optical characteristic or a thermal diffusion function of a display device by mixing a plastic film and a material having excellent light blocking and thermal conductivity.

Flexible display devices according to an exemplary embodiment may not use glass as a base substrate, but may use plastic film as a base substrate, differing from a comparative display device. The plastic film and a carbon or graphite material may be mixed, or a carbon or graphite material may be stack on the plastic film, and the optical characteristic functions of a black tape as well as a base film and the heat preventing function of a heat diffuser sheet may be simultaneously realized. Flexible display devices according to an exemplary embodiment may remove an additional manufacturing and attaching process of black tape and a heat diffuser sheet.

As described, the function of the heat diffuser sheet may be replaced by applying a material with an excellent heat conductivity characteristic, such as a carbon material or a graphite material, to the base film of the flexible substrate applicable to the flexible display device. The optical characteristic of the display device may be improved and a comparative application of the black tape may be replaced by using the light blocking property of a carbon material or a graphite material.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A flexible display device, comprising:
  a display panel for displaying an image; and
  a flexible substrate having a side on which the display panel is supported, the flexible substrate including a plastic film having at least one of a carbon material,
  wherein the flexible substrate further includes a polyethylene terephthalate (PET) coating layer on respective sides of the plastic film, and
  wherein each PET coating layer has a thickness equal to 5 to 10% of a total thickness of the flexible substrate.

2. The flexible display device as claimed in claim 1, wherein the plastic film includes carbon particles mixed in a polymer resin.

3. The flexible display device as claimed in claim 1, wherein the plastic film further includes an electrification inhibitor.

4. The flexible display device as claimed in claim 3, wherein the electrification inhibitor includes one or more of conductive polymers, carbon black, metal powder, metal salt, or a combination thereof.

5. The flexible display device as claimed in claim 1, wherein the plastic film includes a polymer resin.

6. The flexible display device as claimed in claim 5, further comprising an inorganic fiber material mixed in the polymer resin.

7. The flexible display device as claimed in claim 1, further comprising a polyethylene terephthalate (PET) coating layer on the side on which the display panel is supported.

8. A flexible display device, comprising:
  a display panel for displaying an image; and
  a flexible substrate having a side on which the display panel is supported, the flexible substrate including a plastic film having a graphite material,
  wherein the plastic film includes a graphite sheet stacked on a polymer resin.

9. The flexible display device as claimed in claim 8, further comprising an inorganic fiber material mixed in the polymer resin.

* * * * *